(12) United States Patent
Perry

(10) Patent No.: US 7,916,572 B1
(45) Date of Patent: Mar. 29, 2011

(54) MEMORY WITH ADDRESSABLE SUBWORD SUPPORT

(75) Inventor: Steven Perry, High Wycombe (GB)

(73) Assignee: Altera Corporation, San Jose, CA (US)

( * ) Notice: Subject to any disclaimer, the term of this patent is extended or adjusted under 35 U.S.C. 154(b) by 268 days.

(21) Appl. No.: 12/181,311

(22) Filed: Jul. 28, 2008

(51) Int. Cl.
*G11C 8/00* (2006.01)

(52) U.S. Cl. ......... 365/230.03; 365/230.02; 365/230.08; 365/222

(58) Field of Classification Search ............. 365/230.03, 365/230.02, 230.08, 222
See application file for complete search history.

(56) References Cited

U.S. PATENT DOCUMENTS

| | | | |
|---|---|---|---|
| 4,807,189 A | 2/1989 | Pinkham et al. | |
| 4,961,171 A | 10/1990 | Pinkham et al. | |
| 5,638,533 A | 6/1997 | Law et al. | |
| 5,812,483 A | 9/1998 | Jeon et al. | |
| 5,890,195 A | 3/1999 | Rao | |
| 6,370,073 B2 * | 4/2002 | Leung | 365/222 |
| 6,622,197 B1 * | 9/2003 | Kim | 711/100 |
| 6,725,349 B2 * | 4/2004 | Langendorf et al. | 711/170 |
| 7,394,716 B1 * | 7/2008 | Chakrapani et al. | 365/230.03 |
| 2005/0066133 A1 | 3/2005 | Rao | |

* cited by examiner

*Primary Examiner* — Pho M Luu
(74) *Attorney, Agent, or Firm* — Treyz Law Group; G. Victor Treyz; Jason Tsai

(57) ABSTRACT

Integrated circuits are provided that have memory arrays. The memory arrays may include rows and columns of data byte storage locations. To implement algorithms that that process data subwords, a memory array may be partitioned into individual memory banks each of which has its own associated data register and its own associated address decoder. Each address decoder may receive address signals from an associated multiplexer. Address mapping circuits may be used to distribute address signals to multiplexer inputs using an non-blocking memory architecture. The memory architecture allows collections of data bytes to be written and read from the memory array using column-wise and row-wise read and write operations. The data bytes that are written to the array and that are read from the array may be stored in adjacent data byte locations in the array.

20 Claims, 5 Drawing Sheets

| | | | | | | | |
|---|---|---|---|---|---|---|---|
| A⁰ | B¹ | C² | D³ | A⁴ | B⁵ | C⁶ | D⁷ |
| B⁸ | C⁹ | D¹⁰ | A¹¹ | B¹² | C¹³ | D¹⁴ | A¹⁵ |
| C¹⁶ | D¹⁷ | A¹⁸ | B¹⁹ | C²⁰ | D²¹ | A²² | B²³ |
| D²⁴ | A²⁵ | B²⁶ | C²⁷ | D²⁸ | A²⁹ | B³⁰ | C³¹ |
| A³² | B³³ | C³⁴ | D³⁵ | A³⁶ | B³⁷ | C³⁸ | D³⁹ |
| B⁴⁰ | C⁴¹ | D⁴² | A⁴³ | B⁴⁴ | C⁴⁵ | D⁴⁶ | A⁴⁷ |
| C⁴⁸ | D⁴⁹ | A⁵⁰ | B⁵¹ | C⁵² | D⁵³ | A⁵⁴ | B⁵⁵ |
| D⁵⁶ | A⁵⁷ | B⁵⁸ | C⁵⁹ | D⁶⁰ | A⁶¹ | B⁶² | C⁶³ |

MEMORY WITH ADDRESSABLE SUBWORD SUPPORT

BACKGROUND

This invention relates to integrated circuits, and more particularly, to integrated circuits with memory that is used in processing subwords of data.

Memory is widely used in the integrated circuit industry. Memory arrays are formed as part of integrated circuits such as application specific integrated circuits, programmable logic device integrated circuits, digital signal processors, microprocessors, microcontrollers, and memory chips.

Memory arrays often handle data in the form of relatively large data words. For example, data may be read from and written to memory arrays in 32-bit words. Words of this bit length are used to improve efficiency and reduce circuit overhead.

In arrangements in which data is handled in large words, each data word may contain multiple bytes of data. For example, a 32-bit word may contain four eight-bit bytes of data. The data bytes in the data word may sometimes be referred to as subwords.

Many modern data processing algorithms involve the manipulation of subwords of data. For example, it may be necessary to store and retrieve subwords of image data in a memory array when performing image compression. As another example, wireless communications standards such as the emerging 4G wireless communications standards may require the processing of individual subwords. With processing algorithms such as these, it may be desired, for example, to write subwords into a memory array in a column-wise fashion and to read subwords from the same memory array in a row-wise fashion. Operations such as these can be cumbersome in conventional memory arrays, because they require numerous full-word read and write operations and data manipulations such as data shifting and combining operations.

It would therefore be desirable to be able to provide improved memory circuits for handling subword processing operations on integrated circuits.

SUMMARY

In accordance with the present invention, integrated circuits are provided with memory circuitry. The integrated circuits may be programmable integrated circuits such as programmable logic devices that contain blocks of programmable logic. The resources of the blocks of programmable logic or other such circuitry may be configured to implement processing circuitry. The processing circuitry may be used to implement data processing algorithms. In performing the data processing algorithms, the processing circuitry may perform read and write operations on data in the memory circuitry.

The data may be stored in the form of individually addressable data bytes. The data bytes may be stored in rows and columns of data byte locations in a memory array. Multiple adjacent data bytes in the array may be written and read in a single clock cycle. To avoid collisions, the memory array may be partitioned into blocks and each of the adjacent data bytes may be accessed using a different respective memory block within the memory array. Each such memory block may have its own associated data register and its own associated address decoder. Each address decoder may receive address signals from an associated multiplexer. Address mapping circuits may be used to distribute address signals to multiplexer inputs using a non-blocking memory architecture. The memory architecture allows groups of data bytes to be written and read from the memory array using both column-wise and row-wise read and write operations. For example, multiple bytes of data may be written into adjacent locations in the memory array in a column-wise fashion in a single clock cycle. In a different clock cycle, a different set of data bytes may be read from adjacent locations in the memory array in a row-wise fashion (as an example).

Further features of the invention, its nature and various advantages will be more apparent from the accompanying drawings and the following detailed description of the preferred embodiments.

BRIEF DESCRIPTION OF THE DRAWINGS

FIG. 5 is a diagram of an illustrative memory partitioning scheme that may be used to ensure that certain simultaneous adjacent row-wise and column-wise memory subword access operations may be performed satisfactorily in accordance with an embodiment of the present.

DETAILED DESCRIPTION

The present invention relates to memory and processing circuitry that may be used in implementing algorithms in which data is read in memory array rows and written in memory array columns or vice versa. For example, the circuitry may be used in corner turning algorithms and the like. These algorithms typically require the manipulation of multiple independent subwords of data (e.g., data in eight-bit bytes) and can be computationally expensive to implement in conventional memory arrays in which data is handled in large data words (e.g., 32-bit data words).

The circuitry of the present invention may be used in any suitable integrated circuits, such as application-specific integrated circuits, electrically programmable and mask-programmable programmable logic device integrated circuits, digital signal processors, microprocessors, microcontrollers, and memory chips. If desired, the circuitry of the present invention may be used in programmable integrated circuits that are not traditionally referred to as programmable logic devices such as microprocessors containing programmable logic, digital signal processors containing programmable logic, custom integrated circuits containing regions of programmable logic, or other programmable integrated circuits that contain programmable logic and one or more memory arrays.

The present invention is sometimes described herein in connection with memory arrays and associated circuitry on programmable integrated circuits such as programmable logic device integrated circuits. This is, however, merely illustrative. Memory circuitry in accordance with the invention may be used on any suitable integrated circuit if desired.

Figure 1:
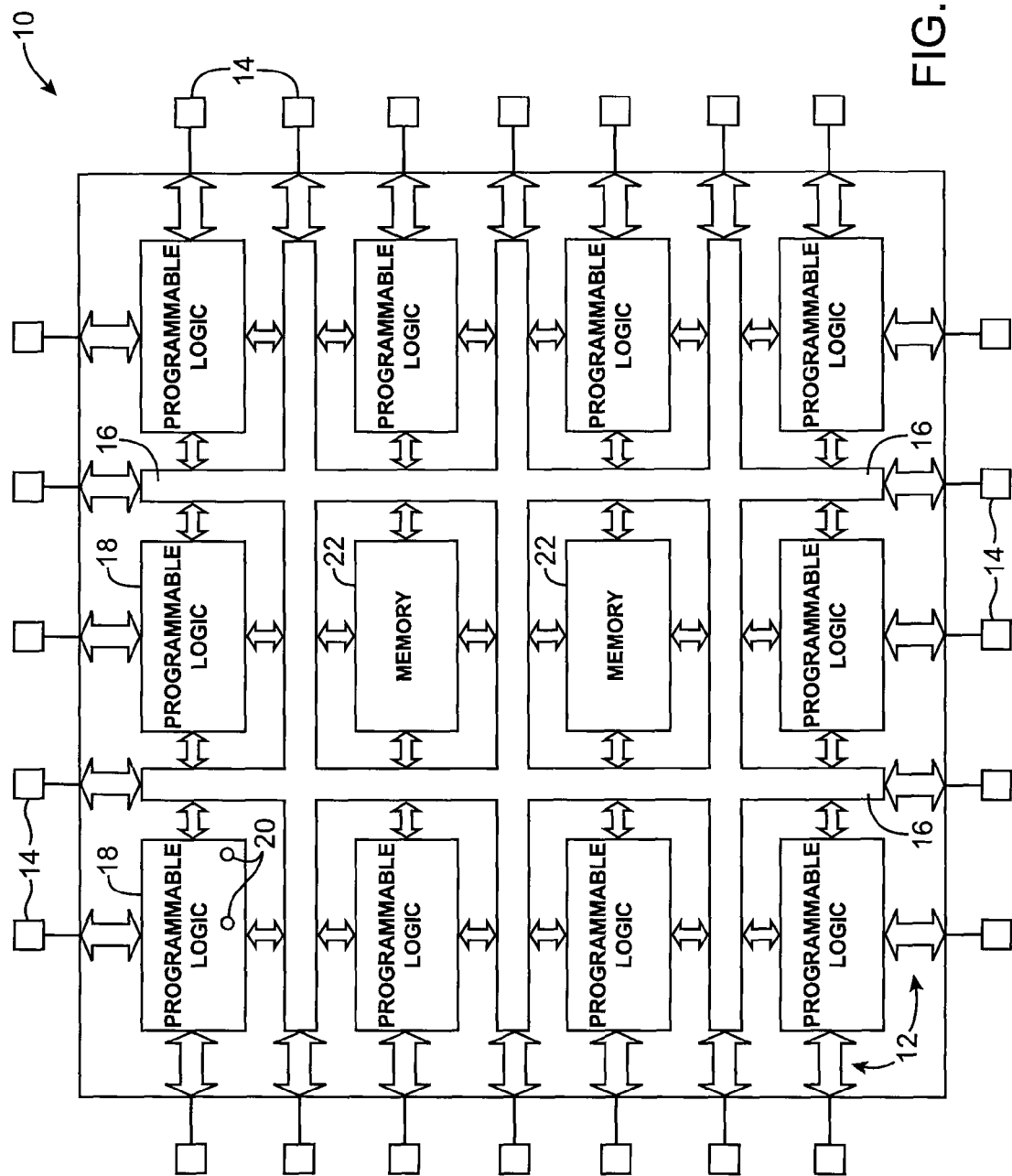
FIG. 1 is a diagram of an illustrative integrated circuit such as a programmable integrated circuit containing memory in accordance with an embodiment of the present invention.

An illustrative integrated circuit device 10 such as a programmable logic device or other programmable integrated circuit in accordance with the present invention is shown in FIG. 1.

Device 10 may have input/output circuitry 12 for driving signals off of device 10 and for receiving signals from other devices via input/output pins 14. Interconnection resources 16 such as global and local vertical and horizontal conductive lines and busses may be used to route signals on device 10. Interconnection resources 16 include conductive lines and programmable connections between respective conductive lines and are therefore sometimes referred to as programmable interconnects 16.

Device 10 may contain programmable logic 18 and memory blocks (arrays) 22.

Programmable logic 18 may include combinational and sequential logic circuitry. The programmable logic 18 may be configured to perform a custom logic function. The programmable interconnects 16 may be considered to be a type of programmable logic 18.

As shown in FIG. 1, device 10 may contain programmable memory elements 20. Memory elements 20 can be loaded with configuration data (also called programming data) using pins 14 and input/output circuitry 12. Once loaded, the memory elements can each provide a corresponding static control output signal that controls the state of an associated logic component in programmable logic 18 such as a logic component formed from one or more metal-oxide-semiconductor transistors. The static control output signals may, for example, be provided to the gates of metal-oxide-semiconductor transistors to turn the transistors on and off to configure logic 18 as desired.

Memory elements 20 may use any suitable volatile and/or non-volatile memory structures such as random-access-memory (RAM) cells, fuses, antifuses, registers, programmable read-only-memory memory cells, mask-programmed and laser-programmed structures, etc. Because memory elements 20 are loaded with configuration data during programming, memory elements 20 are sometimes referred to as configuration memory or configuration RAM. Mask-programmed programmable logic devices, which are sometimes referred to as structured application specific integrated circuits, are programmed by using lithographic masks to create a custom pattern of connections in an array of vias based on configuration data.

Memory arrays 22 may contain rows and columns of volatile memory elements such as random-access-memory (RAM) cells. The memory arrays 22 may be used to store data signals during normal operation of device 10. For example, memory arrays 22 may be used to store data that is being received and processed as part of a wireless communications channel, data that is associated with an image file, or any other suitable data. If desired, software code may be loaded onto memory arrays 22 and executed by processing circuitry on device 10 (e.g., hardwired processing circuitry and processing circuitry implemented using the resources available in programmable logic 18).

The memory arrays 22 on a given device 10 need not all be the same size. For example, small, medium, and large memory arrays 22 may be included on the same programmable logic device (or other integrated circuit). There may, for example, be hundreds of small memory arrays each having a capacity of about 512 bits, 2-9 large memory arrays each having a capacity of about half of a megabit, and an intermediate number of medium size memory arrays each having a capacity of about 4 kilobits. These are merely illustrative memory array sizes and quantities. In general, there may be any suitable size and number of memory arrays 22 on device 10. There may also be any suitable number of regions of programmable logic 18.

The circuitry of device 10 may be organized using any suitable architecture. As an example, the logic of programmable logic device 10 may be organized in a series of rows and columns of larger programmable logic regions each of which contains multiple smaller logic regions. The resources of device 10 such as programmable logic 18 and memory 22 may be interconnected by programmable interconnects 16. Interconnects 16 generally include vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

In addition to the relatively large blocks of programmable logic that are shown in FIG. 1, the device 10 generally also includes some programmable logic associated with the programmable interconnects, memory, and input-output circuitry on device 10. For example, input-output circuitry 12 may contain programmable input and output buffers. Interconnects 16 may be programmed to route signals to a desired destination.

In accordance with the present invention, an integrated circuit (e.g., a programmable integrated circuit or other integrated circuit) may contain memory circuitry (e.g., memory 22 of FIG. 1) that is configured to support data processing algorithms in which multiple subwords (bytes) of data are manipulated in parallel. With circuits in accordance with the present invention, a memory array may be partitioned into multiple blocks. Each block of the memory array may be provided with a corresponding individually-controlled address decoder. Address mapping circuitry may be used to provide address signals to the address decoders for the partitioned array. The address mapping circuitry may be used to implement a memory address tiling pattern that allows multiple adjacent subwords of data in the array to be accessed in both row-wise and column-wise arrangements without stalling the memory. This is not possible in conventional memory arrays in which data is manipulated in relatively large words.

Figure 2:
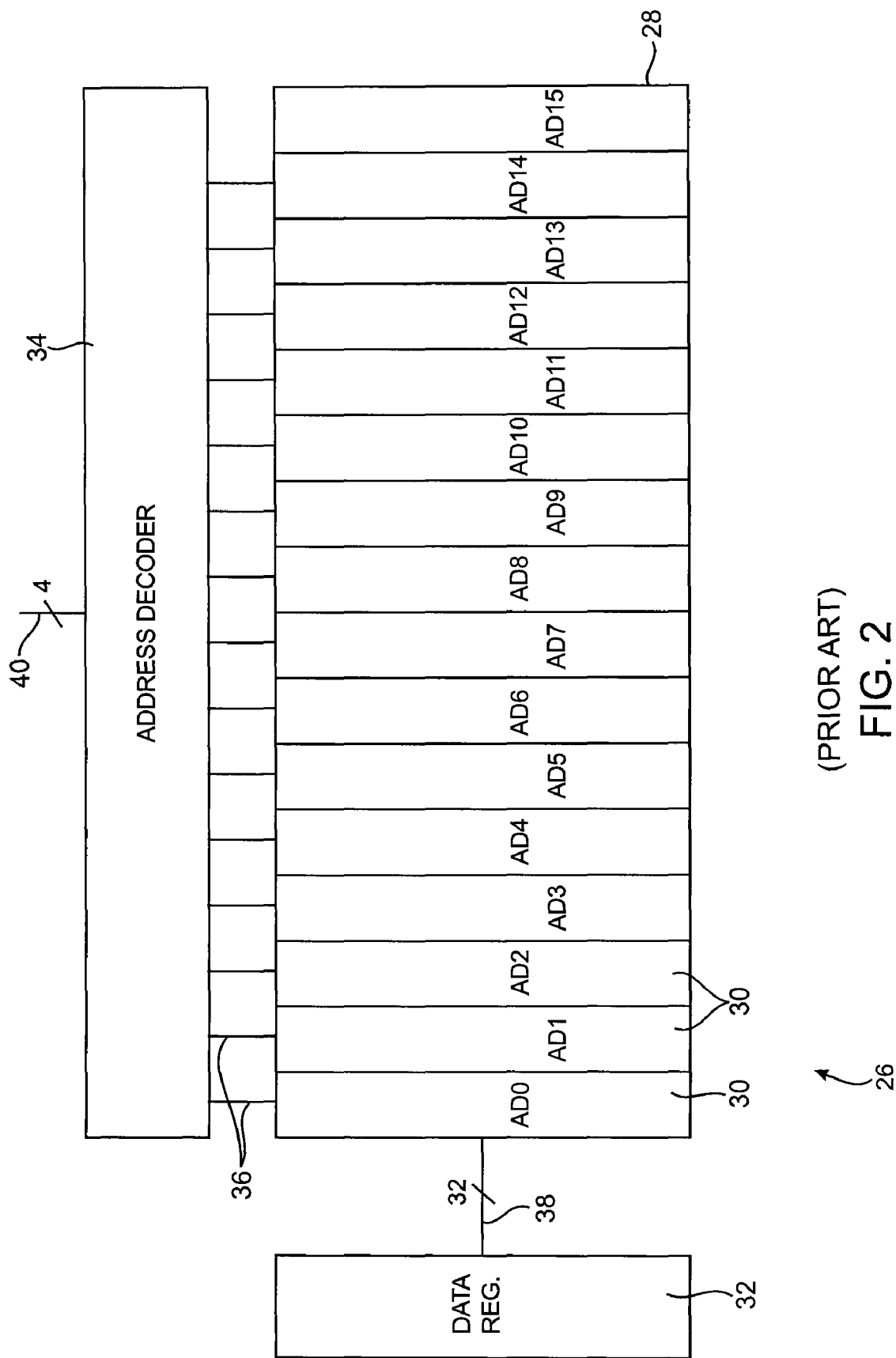
FIG. 2 is a diagram of a conventional memory array in which data is accessed in 32-bit words.

Consider, as an example, the conventional memory circuitry of FIG. 2. As shown in FIG. 2, memory circuitry 26 may include a memory array 28 that is arranged in 16 columns 30, each containing 32 memory cells. With this type of configuration, the memory cells of array 28 may store 512 bits of data. Encoded address signals may be supplied to address decoder 34 over path 40. Four bits of encoded address may be used to uniquely identify which of the 16 columns 30 of array 28 is to be accessed. Address decoder 34 can decode the encoded address that is presented on input 40 and can provide a corresponding unencoded (decoded) version of the address on output lines 36.

Lines 36, which are sometimes referred to as address lines or word lines, may be used to determine which of the columns of memory cells in array 28 are being accessed. Each of lines 36 may be associated with a corresponding address signal (AD0, AD1, AD2, ... AD15). When it is desired to access a particular column in array 28 for reading or writing, the address that is associated with that column may be asserted, while deasserting the addresses associated with the remaining columns in array 28. For example, if it is desired to access the third column from the left in array 28, address signal AD2 may be asserted (e.g., taken to a logic high value) while address signals AD0, AD1, AD3, AD4, . . . AD15 are deasserted (e.g., taken to a logic low value). When signal AD2 is asserted in this way, data may be written into the third column from the left in array 28 from data registers 32 over bit lines (data lines) 38 or data may be read from the third column in array 28 into data registers 32 over bits lines 38. Data register circuitry 32 may be connected to other circuitry on an integrated circuit such as processing circuitry.

In a typical arrangement, memory circuitry 26 of FIG. 2 is used in a system in which data is processed in 32-bit words. Each 32-bit word may be made up of four eight-bit bytes of data. In some scenarios, an application may process data from array 28 using all four bytes from a given column at once. However, not all applications process data in this way. In particular, some data processing algorithms may need to process data on the subword level (i.e., as individual bytes, rather than in four-byte words). It may be necessary, for example, to process the first byte in the column associated with address AD2, the first byte in the column associated with address AD3, the first byte in the column associated with address AD4, and the first byte in the column associated with AD5, rather than the four bytes associated with a particular column. Accessing these bytes of data in array 28 can be cumbersome, because each column of data must be accessed in its entirety using a separate clock cycle, even though only a portion of the data associated with each column is required. Data may then need to be manipulated using shifter circuits. As a result of these inefficiencies, conventional memory array circuits such as circuit 26 of FIG. 2 may be unsuitable for implementing many data processing algorithms.

Memory circuitry in accordance with embodiments of the present invention can overcome these shortcomings of conventional memory arrays by providing the ability to independently access multiple subwords of data in a single clock cycle. This may be accomplished by partitioning a memory array into multiple memory blocks and providing each memory block with associated address decoder circuitry. Address mapping circuitry may be used to support both row-wise and column-wise access to adjacent subwords in the array without collisions.

Figure 3:
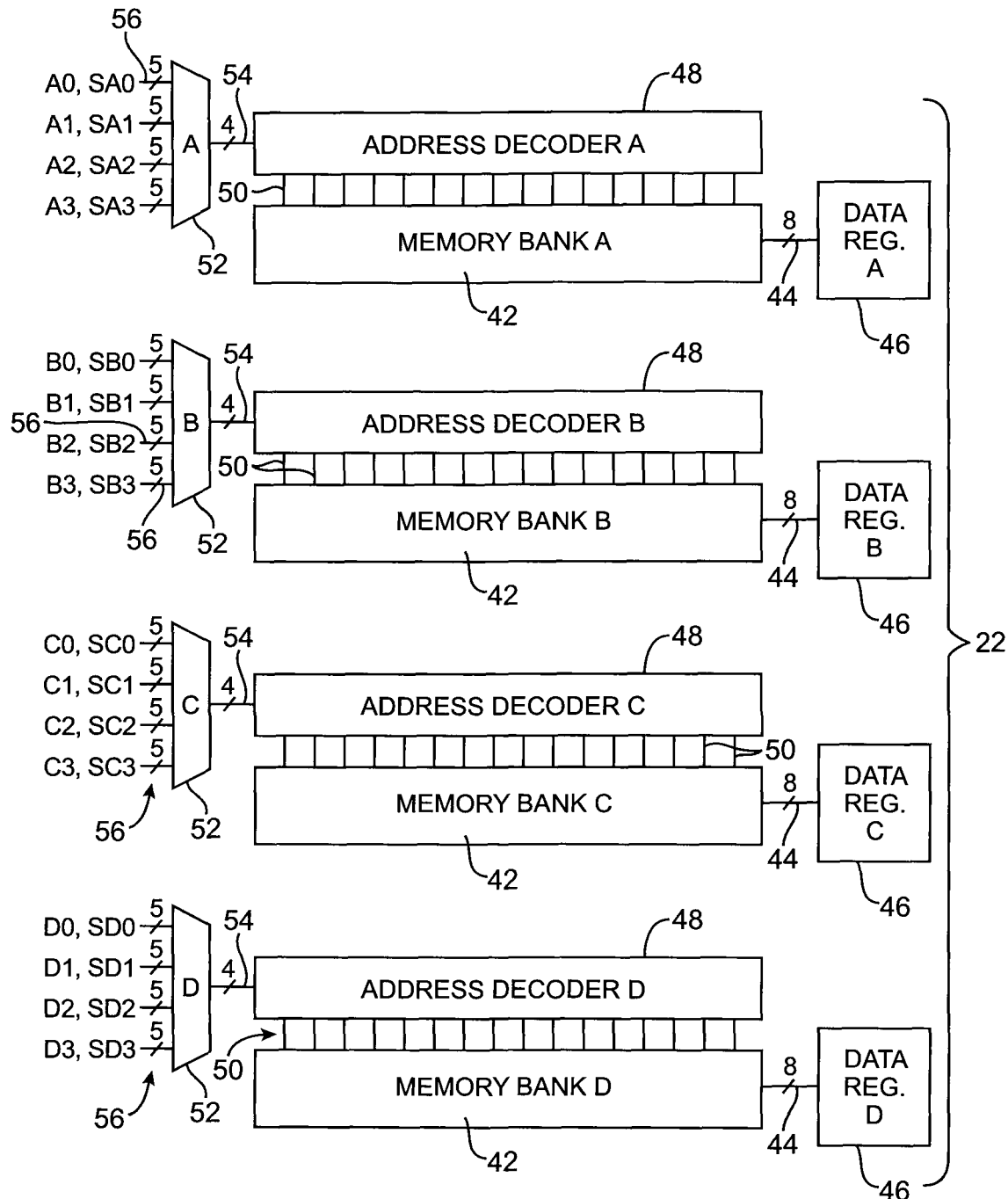
FIG. 3 is a diagram of a memory array that has been partitioned into multiple subarrays to support the individual accessing of subwords of data in accordance with an embodiment of the present invention.

An illustrative memory array using a memory architecture in accordance with the present invention is shown in FIG. 3. As shown in FIG. 3, memory circuitry 22 may be organized in multiple banks of memory 42. Each memory array 42 may, for example, represent a subset of a conventional memory array such as memory array 28 of FIG. 2. There may, in general, be any suitable number of memory banks in a given memory 22. In the example of FIG. 3, memory 22 has been organized in four banks of memory 42. These four memory banks 42 are labeled "memory bank A," "memory bank B," "memory bank C," and "memory bank D" in FIG. 3. This is merely an example. A given memory array may be divided into any suitable number of banks (e.g., more than four banks or fewer than four banks). An arrangement such as the arrangement of FIG. 3 will allow four adjacent subwords to be accessed in a given clock cycle in either a row-wise or column-wise orientation. In a memory 22 with a larger number of memory banks 42 (e.g., six memory banks), a correspondingly larger number of adjacent subwords could be accessed (e.g., six adjacent subwords).

Each memory bank 42 may have a corresponding set of bit lines 44. During writing operations, data may be loaded into memory banks 42 from associated data register circuits 46 over associated bit lines 44. During data reading operations, data may be read from memory banks 42 and may be passed to associated circuitry such as data register circuits 46 over bit lines 44. There are eight bit lines in the set of bit lines 44 associated with each memory bank in the FIG. 3 arrangement. For example, a first set of eight bit lines 44 is used to interconnect memory bank A with data register circuitry A. Similarly, second, third, and fourth sets of eight bit lines each are used in interconnecting memory banks B, C, and D with respective data register circuits B, C, and D.

Each memory bank 42 may have an associated address decoder 48. Address decoder A may be used to provide address signals to memory bank A, address decoder B may be used to provide address signals to memory bank B, address decoder C may be used to provide address signals to memory bank C, and address decoder D may be used to provide address signals to memory bank D.

Address decoders 48 may have inputs 54 at which encoded versions of the address signals are received. Address decoders 48 may decode these encoded address signals to produce corresponding decoded versions of the address signals on address lines 50. Address lines 50 convey these address signals to banks 42 to provide addressing when accessing the data in the memory cells of banks 42. In the FIG. 3 example, each memory bank 42 has 16 associated columns of memory cells, which can be uniquely addressed using the four-bit address provided to the address input 54 for that memory bank. This is merely illustrative. Memory banks 42 may, in general, have any suitable number of memory cells and may be address using any suitable number of address lines.

Each column of the FIG. 3 memory banks contains eight memory cells and is used in storing a respective byte of data. For example, memory bank A contains 16 columns of memory cells and each of these 16 columns contains eight memory cells that store a byte of data that can be accessed using the eight respective bit lines 44 that are associated with memory bank A.

The address signals that are provided to address inputs 54 may be produced by address mapping circuitry connected to the inputs of multiplexers 52. In an arrangement of the type shown in FIG. 3 in which there are four memory banks 42 and four corresponding address decoders 48, there may be four associated multiplexers 52. Each multiplexer 52 may have multiple inputs 56. Each input 56 for a given multiplexer 52 may have multiple address lines and a corresponding control line. For example, the first (topmost) input 56 to multiplexer A may have four address lines that carry four-bit address signal A0 and a control input that carries control signal SA0. The second input 56 to multiplexer A may have four address lines that carry four-bit address signal A1 and a control input that carries control signal SA1. The third and fourth inputs to multiplexer A may be configured similarly. The third input may receive signals A2 and SA2 and the fourth input may receive signals A3 and SA3. Multiplexers B, C, and D may receive the same types of address and control signals.

The control (selection) signals that are applied to each multiplexer input dictate which address signals for that multiplexer are passed to the multiplexer output. To ensure that there are no collisions between address signals, the control signals for each multiplexer may be encoded using a one-hot encoding scheme. With a one-hot encoding scheme, only one of the control signals is asserted (e.g., taken to a logic high value), while all remaining control signals are deasserted (e.g., taken to a logic low value).

Consider, as an example, the control signals SA0, SA1, SA2, and SA3 that are applied to the control inputs of multiplexer A. If a given one of these control signals is asserted, its associated address signals will be passed to the output of multiplexer A on the four lines that make up the address path 54 between multiplexer A and address decoder A. For example, if signal SA0 is taken high, the signal A0 will be routed from the first input of multiplexer A to the output of multiplexer A. Similarly, if signal SA1 is taken high, multiplexer A will route address signal A1 to the output of multiplexer A.

Using a one-hot encoding scheme, the control signals SA0, SA1, SA2, and SA3 never contain more than a single logic high value at a given time. For example, when asserting SA2 to route signal A2 to the output of multiplexer A, signals SA0, SA1, and SA3 may all be taken low. During operation, each multiplexer in memory 22 receives a respective set of one-hot encoded control signals. Multiplexer A receives one-hot encoded control signals SA0, SA1, SA2, and SA3, multiplexer B receives one-hot encoded control signals SB0, SB1, SB2, and SB3, multiplexer C receives one-hot encoded control signals SC0, SC1, SC2, and SC3, and multiplexer D receives one-hot encoded control signals SD0, SD1, SD2, and SD3.

In any given memory access operation (reading or writing), data may be read from or written to each of memory banks A, B, C, and D in a single clock cycle by supplying appropriate address signals and address selection control signals to inputs 56 of multiplexers A, B, C, and D. This allows subwords to be read or written to memory banks A, B, C, and D in various patterns. In accordance with the present invention, a tiled memory architecture is preferably used that prevents access operations for different ports from clashing.

Figure 4:
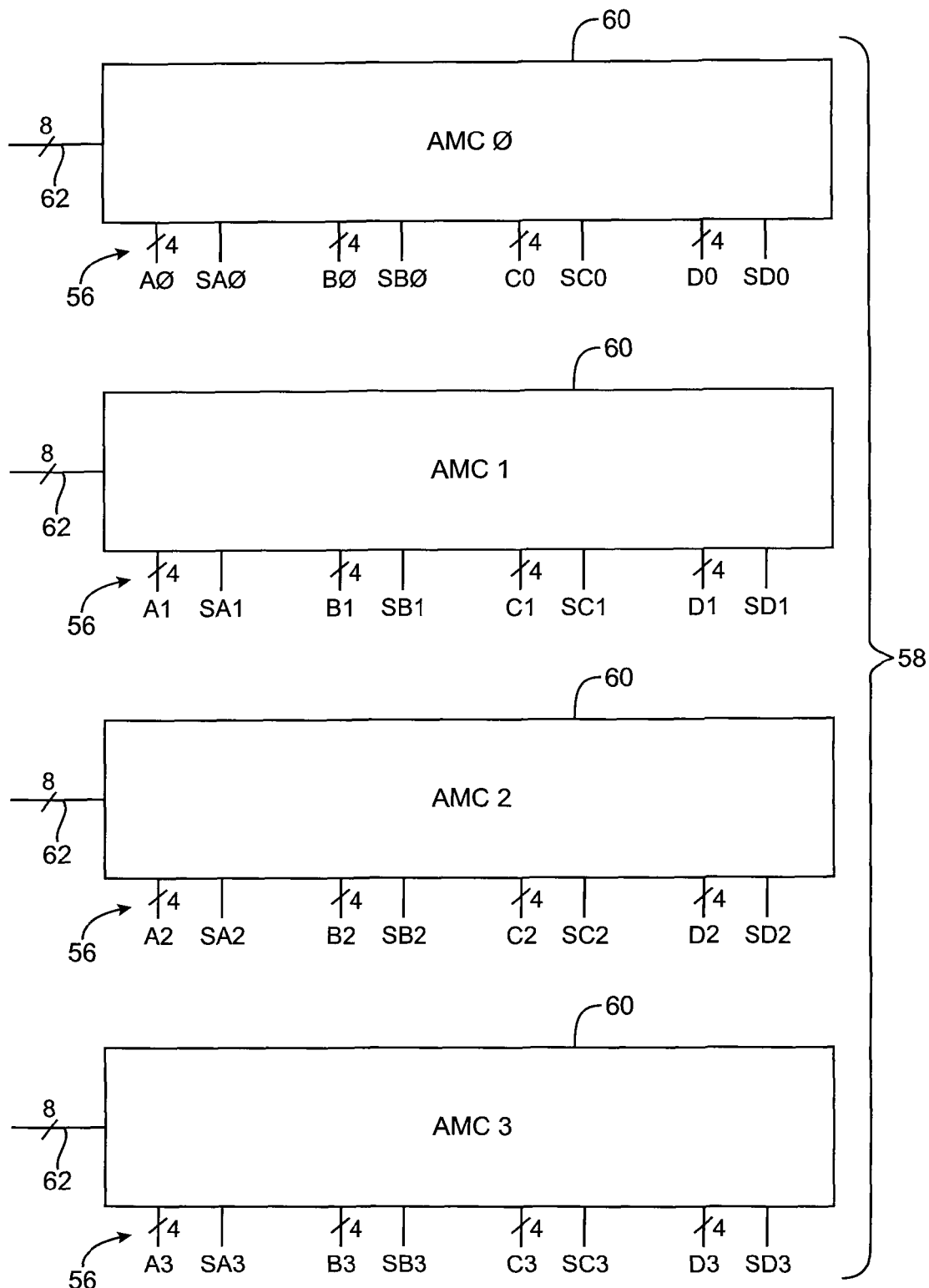
FIG. 4 is a diagram of illustrative address mapping circuitry that may be used in addressing the memory array circuitry of FIG. 3 in accordance with an embodiment of the present invention.

The address mapping functionality required to preventing subword memory access operations in memory 22 from clashing may be embedded in the circuitry of address mapping circuits that produce the addresses and address control signals for the inputs of multiplexers 52. Illustrative address mapping circuitry 58 that may be used to generate the address and control signals for memory 22 of FIG. 3 is shown in FIG. 4. As shown in FIG. 4, address mapping circuitry 58 may include multiple address mapping circuits 60. In the example of FIG. 4, address mapping circuitry 58 (which may be considered to form part of memory circuitry 22 of FIG. 3) includes four address mapping circuits AMC0, AMC1, AMC2, and AMC3 that are used in producing address signals and associated control signals for multiplexers 52 and address decoders 48 of FIG. 3.

Each of the address mapping circuits 60 receives an address signal on its input 62 and produces corresponding address and control signals on its outputs 56. For example, in response to address signals supplied to its input 62, address mapping circuit AMC0 may produce address signals A0 and associated control signal SA0 on a first output 56, may produce address signals B0 and associated control signal SB0 on a second output 56, may produce address signals C0 and associated control signal SC0 on a third output 56, and may produce address signals D0 and associated control signal SD0 on a fourth output 56. Signals A0 and SA0 are presented to the first input of multiplexer A (FIG. 3), signals B0 and SB1 are provided to the first input of multiplexer B (FIG. 3), signals C0 and SC0 are provided to the first input of multiplexer C (FIG. 3), and signals D0 and SD0 are provided to the first input of multiplexer D.

Address mapping circuits AMC1, AMC2, and AMC3 operate similarly. Each of these circuits is controlled by address signals provided on a corresponding address signal input 62. Address mapping circuit AMC1 provides signals A1 and SA1 to the second input of multiplexer A, provides signals B1 and SB1 to the second input of multiplexer B, provides signals C1 and SC1 to the second input of multiplexer C, and provides signals D1 and SD1 to the second input of multiplexer D. Address mapping circuit AMC2 provides signals A2 and SA2 to the third input of multiplexer A, provides signals B2 and SB2 to the third input of multiplexer B, provides signals C2 and SC2 to the third input of multiplexer C, and provides signals D2 and SD2 to the third input of multiplexer D. Address mapping circuit AMC3 provides signals A3 and SA3 to the fourth input of multiplexer A, provides signals B3 and SB3 to the fourth input of multiplexer B, provides signals C3 and SC3 to the fourth input of multiplexer C, and provides signals D3 and SD3 to the fourth input of multiplexer D.

The address mapping circuitry associated with memory array circuits of the present invention preferably creates address mappings that avoid collisions when accessing adjacent memory ports in memory 22. In many data processing algorithms implemented using processing circuitry on device 10 it may be desirable to access memory 22 in one dimension (e.g., column-wise) when performing a write operation and in an orthogonal dimension (e.g., row-wise) when performing a read operation. In these operations, subwords (bytes) of data may be accessed individually, without processing extraneous data in relatively large (e.g., 32 bit) data words.

An arrangement of this type is illustrated in the diagram of FIG. 5. The FIG. 5 diagram shows an illustrative tiled memory architecture that may be used for memory 22 that avoids memory port collisions when accessing multiple adjacent subwords using column-wise and row-wise arrangements. The diagram of FIG. 5 corresponds to a memory array 22 that has 64 subwords (bytes) of data storage capacity (as with the memory array of FIG. 3). In FIG. 5, these 64 subwords of data are arranged in an 8×8 array and are associated with 64 separate addresses. For example, the tile (square) in the first row and first column of the array of FIG. 5 is labeled "0" because the address "0" is associated with this subword. As another example, the square in the last column and last row of the memory array of FIG. 5 is labeled "63" because the address "63" is associated with the subword of data stored in this array position.

Although represented as an 8×8 array of subwords, it will be appreciated that any suitable physical layout shape may be used for a given memory array 22. For example, a 64-byte (512 bit) array may be provided using memory cells that are organized in four banks each with 16 columns of 8 bits each, as described in connection with the illustrative arrangement of FIG. 3. The use of the 8×8 arrangement of FIG. 5 is merely illustrative.

The memory locations of the subwords in the array of FIG. 5 are each associated with a respective memory bank. For example, the subword at address "0" is associated with memory bank A. During read and write operations, the subword corresponding to address "0" will be stored in memory bank A (e.g., in the first column of memory bank A). Similarly, the subword at address "1" is associated with memory bank B, the subword at address "2" is associated with memory bank C, the subword at address "3" is associated with memory bank D, etc.

The memory architecture of FIG. 5 allows adjacent subwords to be written to memory 22 and read from memory 22 in both row-wise and column-wise schemes as needed to efficiently implement various data processing algorithms (e.g., corner turning algorithms, etc.). Because of the tiling pattern that is used in the array of FIG. 5, adjacent memory ports (i.e., ports associated with each of the inputs 62 in FIG. 4) do not clash.

Consider, as an example, a column-wise write operation involving the four subwords 64 of FIG. 5. In this scenario, it is desired to write four subwords (bytes) of data into memory 22: a first subword at address 18, a second subword at address 26, a third subword at address 34, and a fourth subword at address 42. As indicated by the labels of FIG. 5, these subwords are associated with storage locations in memory banks A, B, C, and D, respectively. Because each subword is written into a different memory bank 42 using a different address decoder 48, all four of the subwords can be written in a single simultaneous column-wise write operation (i.e., in one clock cycle). As a result of the pattern of FIG. 5, the same is true for any four adjacent subwords in the memory array, even if the first subword that is written is not written into memory bank A. For example, when performing a column-wise write operation on subwords 66, the subword associated with address 30 is stored in memory bank B, the subword associated with address 38 is stored in memory bank C, the subword associated with address 46 is stored in memory bank D, and the subword associated with address 54 is stored in memory bank A.

In some data processing algorithms, it may be desirable to perform a row-wise read operation (e.g., after performing a column-wise write operation). For example, the four adjacent subwords 68 of FIG. 5 may be read in a row-wise fashion. Because of the tiling scheme used for the memory of FIG. 5, each adjacent subword in this row-wise read operation is read from a different memory bank. In particular, the subword at address 3 is read from memory bank D, the subword at address 4 is read from memory bank A, the subword at address 5 is read from memory bank B, and the subword at address 6 is read from memory bank C. Each of these memory banks is different, so the row-wise read operation of adjacent subwords 68 may be performed in a single clock cycle.

Address mapping circuitry 58 of FIG. 4 may be used in producing the address signals for address decoders 48 of FIG. 3. Consider, as an example, the situation in which subwords 68 of FIG. 5 are being read from memory 22. In this example, a first address (e.g., address "3") is provided to address mapping circuit AMC0 at its input 62. In response, address mapping circuit AMC0 produces a one-hot encoded control signal in which signal SD0 is high and signals SA0, SB0, and SC0 are low. Address signals associated with the asserted SD0 control signal are provided on address signal output D0. Because address 3 corresponds to the first (lowest address) memory location in memory bank D that is being used in the array of FIG. 5, address D0 may be, for example, 0000.

At the same time that address D0 is being provided by address mapping circuit AMC0, address "4" is being provided to the address input 62 of address mapping circuit AMC1, address "5" is being provided to the address input 62 of address mapping circuit AMC2, and address "6" is being provided to the address mapping circuit AMC3. In response, address mapping circuit AMC1 produces a high SA1 control signal (and corresponding address signals A1) and produces low control signals SB1, SC1, and SD1. Because address 4 corresponds to the second memory location in memory bank A that is being used in the array of FIG. 5, address A1 may be, for example, 0001. Address mapping circuit AMC2 produces a high SB2 control signal (and corresponding address signal B2) and produces low control signals SA2, SC2, and SD2. Because address 5 corresponds to the second memory location in memory bank B that is being used in the array of FIG. 5, address B2 may be, for example, 0001. Address mapping circuit AMC3 produces a high SC3 control signal (and corresponding address C3) and produces low control signals SA3, SB3, and SD3. Because address 6 corresponds to the second memory location in memory bank C that is being used in the array of FIG. 5, address C3 may be, for example, 0001.

When these signals are received by multiplexers 52 of FIG. 3, the asserted control signals configure multiplexers 52 to route appropriate address signals from their inputs to their outputs. In particular, the asserted SD0 control signal directs multiplexer D of FIG. 3 to route address D0 from its input to the input 54 of address decoder D, the asserted SA1 control signal directs multiplexer A of FIG. 3 to route address A1 from its input to the input 54 of address decoder A, the asserted SB2 control signal directs multiplexer B of FIG. 3 to route address B2 from its input to the input 54 of address decoder B, and the asserted SC3 control signal directs multiplexer C of FIG. 3 to route address C3 from its input to the input 54 of address decoder C.

This type of scheme may be used for any four adjacent subwords in both column-wise addressing schemes and row-wise addressing schemes, and in both write operations and read operations. More than four adjacent subwords can be handled simultaneously by partitioning memory 22 into more memory blocks (e.g., memory blocks E, F, etc.) and by providing corresponding address decoders, multiplexers, and address mapping circuits. If desired, memory architectures such as the memory architecture of FIG. 5 may be used to support other types of simultaneous read and write operations. For example, the tiling scheme of FIG. 5 may be modified so that there are no repetitions when reading memory locations along diagonals, etc.

The foregoing is merely illustrative of the principles of this invention and various modifications can be made by those skilled in the art without departing from the scope and spirit of the invention.

What is claimed is:

1. A memory array, comprising:
   a plurality of memory banks;
   a plurality of respective address decoders that produce respective address signals for addressing the memory banks; and
   a plurality of multiplexers each of which has an output that provides a corresponding one of the address signals to a corresponding one of the address decoders, wherein each of the multiplexers has a plurality of inputs, each input having a respective address input and a respective control input, and wherein when a control signal is asserted on the control input of a given one of the inputs of a given multiplexer, address information on the address input of that given one of the inputs is routed to the output of the given multiplexer.

2. The memory array defined in claim 1 further comprising address mapping circuitry that receives a plurality of address signals on respective address mapping circuit inputs and that provides corresponding control signals and associated address information to the inputs of the multiplexers.

3. The memory array defined in claim 2 wherein the memory banks contain memory cells that store data bytes and wherein the address mapping circuitry, multiplexers, and address decoders are configured to write each of a plurality of the data bytes into a respective one of the memory banks in a single clock cycle.

4. The memory array defined in claim 2 wherein the memory banks contain memory cells that store data bytes and wherein the address mapping circuitry, multiplexers, and address decoders are configured to read each of a plurality of the data bytes from a respective one of the memory banks in a single clock cycle.

5. The memory array defined in claim 2 wherein the memory banks contain memory cells that store data bytes and wherein the address mapping circuitry, multiplexers, and address decoders are configured to write each of a plurality of the data bytes into a respective one of the memory banks in a first clock cycle and are configured to read each of a plurality of the data bytes from a respective one of the memory banks in a second clock cycle.

6. The memory array defined in claim 2 wherein the memory banks contain memory cells that store data subwords and wherein the address mapping circuitry, multiplexers, and address decoders are configured to perform a column-wise write operation on the memory circuitry to write each of a plurality of the data subwords into a respective one of the memory banks in a first clock cycle and are configured to perform a row-wise read operation on the memory circuitry to read each of a plurality of the data subwords from a respective one of the memory banks in a second clock cycle.

7. The memory array defined in claim 2 wherein the memory banks contain memory cells that store data subwords and wherein the address mapping circuitry, multiplexers, and address decoders are configured to perform a row-wise write operation on the memory circuitry to write each of a plurality of the data subwords into a respective one of the memory banks in a first clock cycle and are configured to perform a column-wise read operation on the memory circuitry to read each of a plurality of the data subwords from a respective one of the memory banks in a second clock cycle.

8. A method of accessing data in a memory array formed from multiple memory banks, comprising:
   accessing a plurality of subwords of data from adjacent memory locations within the memory array in a single clock cycle, wherein the each subword is stored in a different one of the memory banks.

9. The method defined in claim 8 wherein accessing the plurality of subwords comprises writing each of the subwords into a respective one of the memory banks to perform a column-wise write operation on the memory array.

10. The method defined in claim 9 further comprising:
    in different single clock cycle, reading each of the subwords from a respective one of the memory banks to perform a row-wise read operation on the memory array.

11. The method defined in claim 8 wherein accessing the plurality of subwords comprises writing each of the subwords into a respective one of the memory banks to perform a row-wise write operation on the memory array.

12. The method defined in claim 11 further comprising:
    in different single clock cycle, reading each of the subwords from a respective one of the memory banks to perform a column-wise read operation on the memory array.

13. The method defined in claim 8 wherein accessing the plurality of subwords comprises reading each of the subwords from a respective one of the memory banks using a respective one of a plurality of address decoders to perform a column-wise read operation on the memory array.

14. The method defined in claim 8 wherein accessing the plurality of subwords comprises reading each of the subwords from a respective one of the memory banks using a respective one of a plurality of address decoders to perform a row-wise read operation on the memory array.

15. An integrated circuit, comprising:
    a memory array partitioned into a plurality of memory banks, wherein the memory array has a plurality of rows and columns of data byte storage locations, each data byte storage location storing a single data byte; and
    circuitry for storing a plurality of data bytes in the memory array at respective adjacent data byte storage locations by storing each of the plurality of data bytes in a respective one of the memory banks, wherein the circuitry is configured to store each of the plurality of data bytes in a different one of the adjacent data byte storage locations.

16. An integrated circuit, comprising:
    a memory array partitioned into a plurality of memory banks, wherein the memory array has a plurality of rows and columns of data byte storage locations; and
    circuitry for storing a plurality of data bytes in the memory array at respective adjacent data byte storage locations by storing each of the plurality of data bytes in a respective one of the memory banks, wherein the circuitry comprises:
    bit lines; and
    a plurality of data register circuits each of which is associated with a respective one of the memory banks and which is connected to that memory bank by a corresponding set of the bit lines.

17. The integrated circuit defined in claim 16 further comprising:
    a plurality of address decoders each of which has address lines that are coupled only to a respective one of the memory banks.

18. The integrated circuit defined in claim 17 further comprising a plurality of multiplexers each of which has a multiplexer output connected to an input of a respective one of the address decoders.

19. The integrated circuit defined in claim 18 further comprising a plurality of address mapping circuits each of which provides a plurality of different address, wherein for each address mapping circuit:
    each of the plurality of different addresses provided by the address mapping circuit is provided to a different one of the multiplexers.

20. An integrated circuit, comprising:
    a memory array partitioned into a plurality of memory banks, wherein the memory array has a plurality of rows and columns of data byte storage locations;
    circuitry for storing a plurality of data bytes in the memory array at respective adjacent data byte storage locations by storing each of the plurality of data bytes in a respective one of the memory banks; and
    programmable logic that implements processing circuitry that accesses the memory array.

* * * * *